(12) United States Patent
Rawlings

(10) Patent No.: US 7,678,997 B2
(45) Date of Patent: Mar. 16, 2010

(54) LARGE AREA CIRCUITRY USING APPLIQUÉS

(75) Inventor: Diane C. Rawlings, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 211 days.

(21) Appl. No.: 11/612,576

(22) Filed: Dec. 19, 2006

(65) Prior Publication Data
US 2008/0142238 A1 Jun. 19, 2008

(51) Int. Cl.
H01B 7/08 (2006.01)
(52) U.S. Cl. .................................. 174/117 FF; 174/2
(58) Field of Classification Search ............ 174/117 FF, 174/117 A, 2, 250
See application file for complete search history.

(56) References Cited

U.S. PATENT DOCUMENTS

| 3,416,027 A | * | 12/1968 | Amason et al. ............... 315/36 |
| 4,460,804 A | * | 7/1984 | Svejkovsky ............. 174/117 A |
| 5,072,520 A | | 12/1991 | Nelson |
| 7,223,312 B2 | * | 5/2007 | Vargo et al. ..................... 156/71 |
| 7,335,837 B2 | * | 2/2008 | Pfeiler et al. ................... 174/36 |
| 2004/0069895 A1 | | 4/2004 | Pham et al. |
| 2005/0150596 A1 | | 7/2005 | Vargo et al. |
| 2005/0181203 A1 | | 8/2005 | Rawlings et al. |
| 2005/0257956 A1 | | 11/2005 | Marshall et al. |

FOREIGN PATENT DOCUMENTS

| WO | 2004012937 A1 | 2/2004 |
| WO | 2006025890 A2 | 9/2006 |

* cited by examiner

*Primary Examiner*—Chau N Nguyen
(74) *Attorney, Agent, or Firm*—McNees Wallace & Nurick, LLC

(57) ABSTRACT

An appliqué for forming a surface coating to a substrate is disclosed. The appliqué contains a sectioned metal foil that provides a large area electrical circuit for connecting electrical devices. The appliqué may provide additional functions including lightning strike protection. The substrate may be an aircraft surface.

20 Claims, 2 Drawing Sheets

LARGE AREA CIRCUITRY USING APPLIQUÉS

FIELD OF THE INVENTION

The present invention relates generally to an appliqué containing a sectioned metal foil that provides an electronic circuit for supplying electrical current to electrical devices. The appliqué may also provide additional functions including but not limited to protection against lightning strikes, deicing, and equipment monitoring.

BACKGROUND OF THE INVENTION

Appliqués are of considerable interest today for commercial and military application. Flight tests have been conducted on paintless aircraft technologies that use an outer surface of a material such as appliqué. These appliqués save production costs, support requirements, and aircraft weight while providing significant environmental advantages. Some of these appliqués are described in greater detail in U.S. Pat. No. 6,177,189, assigned to the assignee of the present invention, which is incorporated by reference. Further, some commercial airlines, including Western Pacific, use appliqués to convert their transports into flying billboards.

An appliqué provides an advantage of covering a surface with a hydrophobic or superhydrophobic material that may also provide rain erosion resistance. This material is easily applied and removed. This results in a reduction in aircraft maintenance and improves service life.

In addition to the above advantages, appliqués may also provide protection against lightning strikes. Lightning strikes may potentially cause damage to aircraft, especially composite aircraft. To reduce this damage, appliqués may incorporate a layer of a conductive metal foil to reduce damage from these lightning strikes by spreading out the charge of the lightning strike over a large surface area and by directing the charge away from more critical aircraft components. The metal foil may be solid, patterned or a combination of solid and patterned in the appliqué so as to reduce and divert the discharge of the lightning strike. A description of an appliqué providing such protection against lightning strikes is described in U.S. Pat. Pub. No. 2006/0051592, filed Sep. 19, 2005, U.S. Pat. Pub. No. 2005/0181203, filed Sep. 15, 2004 and U.S. Pat. No. 4,352,142, filed Apr. 15, 1981, assigned to the assignee of the present invention, and incorporated herein by reference.

Up to this time, however, appliqués have been limited in the functions and advantages that they provide, such as lightning strike protection, and an opportunity exists to increase the number of functions that may be provided by appliqués.

Currently, electrical devices are placed on, inside or within the aircraft surface. Electrical connections to these electrical devices have been by hard wiring provided by narrow wires or bundles of wires carried internal or external to the aircraft skin. If the wires are placed on the interior of the aircraft, it is necessary to drill holes through the aircraft skin to connect the wires to external electrical devices and may necessitate a re-certification of the aircraft. In most cases, hard wires cannot be placed external to the aircraft skin because of aerodynamic and safety considerations.

Narrow, thin connections such as those provided by standard flexible thin circuitry may provide a solution to problems associated with hard wiring by placing the connections on the exterior of the aircraft skin in such a manner that the connections are both aerodynamic and safe. Additionally, such circuitry connections must be made resistant to impact, aircraft fluids, water, a wide range of temperature fluctuations, abrasion and UV exposure. Thin circuitry may be applied by printing with conductive inks or etching from sputtered metal films. However, circuitry external to the aircraft skin is readily damaged by physical contact and distortion and elongation of the film, and is prone to electrical overheating.

A solution to these problems may be realized by using appliqués containing sections of foil that provide a large area circuit. The foil sections of these appliqués may provide a robust electrical connection to devices including deicing resistors, aircraft monitoring equipment, solar cells and other power sources, sensors, and lights, some of which may be directly embedded within the appliqué while limiting intrusion into the structure of the aircraft in addition to providing lightning strike protection.

By making an electrical connection through large area sections of the foil that are part of an appliqué, a more robust system may be obtained, since a part of the foil providing electrical connectivity may be damaged and still allow the foil to provide electrical connectivity to a device. Additionally, large area sectioned circuitry foils may allow for elongation of the films containing the circuitry without breaking the electrical paths within the circuitry and help the circuitry foil to conform to a complex 3-dimensional surface such as an aircraft skin.

Most importantly, the appliqué containing the sectioned foil, in addition to providing a large area circuit, may also provide additional functions including, but not limited to, protection against lightning strikes, deicing, and equipment monitoring.

Therefore, a need exists to provide an appliqué that can perform a wide range of functions including, but not limited to, electrical circuitry, lightning strike protection, deicing, and equipment monitoring.

Other features and advantages of the present invention will be apparent from the following more detailed description, taken in conjunction with the accompanying drawing which illustrates, by way of example, the principles of the invention.

SUMMARY OF THE INVENTION

The present invention provides for a multifunctional appliqué that may be used as a surface coating, such as a low cost replacement for paint. The appliqué of the present invention includes a sectioned metal foil that provides a large area circuit for supplying electricity to devices. The sectioned metal foil may provide a variety of functions to the appliqué. The sectioned metal foil may provide protection against lightning strikes. The sections of the foil that provide the circuitry function may also provide the lightning strike protection function and/or additional foil sections may be present in the appliqué that perform only circuitry functions or lightning protection. The sectioned metal foil providing the large area circuit may supply electrical power to electrical devices including sensors, lights, resistors, power supplies, antennas, communications devices, identification tags, micromechanical devices, and computer chips and may provide functions including, but not limited to, deicing and equipment monitoring.

Appliqués containing a sectioned metal foil have been formed that cover commercial aircraft fuselage lengths of about 200 feet, and aircraft wing lengths of about 100 feet. A single appliqué may be less than about an inch to more than about several feet wide, with widths of about 36 inches and 48 inches commonly used to provide a surface film for an aircraft. A single appliqué may be less than an inch in length up to the length of a commercial aircraft fuselage or wing length, or up to approximately 200 feet, although greater lengths are possible depending upon application. Appliqués may be formed of any shape and aspect ratio, depending upon application.

The appliqué including the sectioned foil may be applied internally as well as externally to a structure, such as an aircraft structure or skin. The appliqué may be applied internally to walls or panels to provide a low cost robust electrical connection thereto.

The large area circuit provided by the sectioned metal foil of the appliqué of the present invention provides a robust electrical circuit. This large area circuit allows current to be carried in extended areas of the foil rather than in thin and narrow printed circuits or wires. This invention further provides for a large area circuit of low resistance, providing low electrical loss and low heat generation, and that is capable of delivering large total power.

According to a non-limiting embodiment of the present invention, an appliqué coating is provided for a substrate. The appliqué coating includes a sectioned metal foil and a dielectric layer underlying the foil. The foil is sectioned so as to form separate electrical connections creating a circuit throughout the foil. The electrical circuit is capable of providing both positive and negative electrical connections to an electrical device. The device may be underneath, external or embedded within the appliqué.

The sectioned foil may provide multiple functions to the appliqué. For example, a section of the foil providing a large area circuit may also provide lightning protection by conducting or spreading the lightning energy through the appliqué. The appliqué may contain multiple sections that may provide additional functions including lightning protection, deicing and monitoring. Each section may perform multiple functions. The appliqué may be formed having sections that contain no foil sections.

A topcoat may overly the sectioned foil. The topcoat may be provided as a layer of paint or as a second polymer film. The topcoat may be superhydrophobic or hydrophobic and extremely smooth. The topcoat may be coupled with miniature or micro shape changing devices to facilitate detachment of ice that may build on the surface. Additionally, an inductive grid formed by resistive ink may be included in the topcoat overlying the foil to help reduce static charge buildup.

An adhesive, such as a pressure sensitive adhesive, underlying the first polymer film, may be provided to affix the appliqué coating to the substrate. If desired, fibers may be dispersed throughout the second polymer film to provide anti-static properties. These fibers may be carbon fibers. An ink layer, or other patterned or colored layer, may be provided between the metal foil and the topcoat or second polymer film, for aesthetic and/or anti-static purposes.

The sectioned metal foil may be formed from any conductive material. The sectioned foil may be formed of an aluminum foil, but other conductive materials, including copper foil, may be used. The sectioned foil may be formed of sections of different conductive materials. The thickness of separate sections of the metal foil may vary, and an individual section of the foil may vary in thickness.

The dielectric layer, between the sectioned metal foil and the substrate may be a polymer film. The polymer film may be selected from any one or a combination of polyamide (nylon), poly ether ether ketone (PEEK), polysulfonate, polyesters such as, but not limited to, polyethylene terephthalate (PET) and poly-ethylene naphthalatae (PEN), polyimide, polyolefins such as but not limited to polyethylene and polypropylene, polyurethane, halopolymer, and two-layer polymer film combinations such as but not limited to polyester/polyethylene combination, polyester/nylon combination, PEEK/polyethylene combination, and a PEEK/nylon combination. Other polymer films and combinations including but not limited to fluorinated ethylene-propylene (FEP), polytetrafluoroethylene (PTFE) polymers including Teflon® as produced by E.I. du Pont de Nemours and Company, polyether sulphone (PES), polyetherketone (PEK) and polyethylene imine (PEI) may be used.

According to another embodiment of the invention, an appliqué coating is provided for a substrate that has a fastener extending therethrough. The appliqué coating includes a sectioned metal foil and a dielectric layer underlying the foil. The dielectric layer is interposed between the foil and a head of the fastener. The dielectric layer creates a dielectric withstand voltage over the fastener, to insulate the sectioned metal foil from the fastener. The dielectric layer also creates an insulating layer against lightning strikes upon the appliqué coating. This increased protection against lightning strikes may be desirable, for example, for fasteners that extend through skin of an aircraft wing into a wing box that may be wetted with fuel. An adhesive layer may be further interposed between the dielectric layer and the head of the fastener. The adhesive layer may be thermosetting, pressure-sensitive, heat-activated or thermoplastic.

The sectioned metal foil may be formed to act as both an electrical circuit for supplying energy to devices and as a lightning diverter. This may be accomplished by providing separate sections of the metal foil that are electrically isolated from one another by a gap or insulating barrier so that one section of the foil provides for the large area circuit and another area of the foil provides for lightning diversion. The large area circuit section of the foil may also provide additional lightning protection.

Sections of the foil that perform lightning protection may be formed of solid foil sections or patterned foil sections. The patterned foil section may be patterned into a grid or perforated foil. The patterned foil section may provide for the improved development of localized coronas to disperse electrical energy from a lightning strike. The localized coronas transport the energy of a lightning strike above the substrate's surface with very limited removal of metal foil from the location of attachment of the lightning strike or from surrounding regions. The sections of the patterned metal foil providing protection from lightning strikes can conduct the energy of a lightning strike over a wide area via multiple pathways created by the patterned metal foil.

Solid foil sections may also be present in the appliqué to carry or divert electrical energy of a lightning strike along a desired path within the appliqué. The solid foil sections may be used in combination with the patterned foil sections to control and distribute electrical energy from lightning strikes. Both or either the solid foil and patterned foil sections providing lightning strike protection may be used in the appliqué with the sections of foil providing large area circuitry, as long as electrical isolation of the sections performing large area circuitry and the sections providing specific lightning strike protection is provided. The sections of foil may be electrically isolated by providing a sufficient gap between the sections of foil.

The dielectric layer prevents the lightning strike energy from spreading to the aircraft frame. As a result, energy stays on the appliqué and either spreads out substantially uniformly or as directed by the sectioning and/or patterning of the foil. This dispersion distributes the energy of the lightning strike over a large area, thereby lowering the charge density in any localized area. If the electrical energy does find a path to the underlying structure, then advantageously the appliqué has distributed the energy into many different, lower energy paths into the structure.

An exemplary large area circuit within an appliqué includes a sectioned metal foil and a dielectric layer that may be a polymer film underlying the sectioned metal foil. The sectioned metal foil may be sectioned throughout, or the foil may be partially sectioned and contain solid foil sections. The sectioned metal foil may be sectioned to create metal foil sections that are electrically connected to form a large area circuit and other sections that form lightning strike protection without associated electrical circuitry. The sections providing for lightning strike protection may be patterned. The latter sections may be located where the probability or severity of a lightning strike is highest. A topcoat overlying the sectioned metal foil may be provided as a layer of paint or as a polymer film. An adhesive, such as a pressure sensitive adhesive, underlying the dielectric layer may be provided to affix the appliqué to a substrate.

The appliqué may be formed of individual appliqué sections known as gores that may provide one or a combination of different functions. For example, a gore may provide one or both of a large area circuit or a lightning strike protection function. Thus an appliqué can be assembled to provide multifunction capability. Alternatively, the appliqué can be a single unit that contains sections of foils providing one or more of the above functions.

If desired, semiconductor particulates may be dispersed throughout the second polymer film to contribute to instantaneous generation of localized coronas in the areas of the appliqué providing lightning protection. These particulates may also be present in the topcoat in the areas of the appliqué providing a large area circuit as long as the particles to not provide electrical pathways from the circuit. An ink layer may be provided between the sectioned metal foil and the topcoat or on the exterior surface of the appliqué, if desired, for aesthetic and/or anti-static purposes.

According to the invention, the sectioned metal foil may include a plurality of sections. Sections of the foil may be separated from each other by a gap. The gaps or voids may be of any desired shape, and the width of the gaps or voids may vary. The gap width is determined by the amount of electrical energy carried by the sections adjacent the gap and, in the case of an application of the appliqué over an antenna or radome for lightning protection, by the frequency of radiation being transmitted across the sectioned foil by the antenna or similar device. Gaps as small as about 0.0005 inches has been formed between sections of foil. Gaps of about 0.020 inches have been shown to provide a good separation for the large area circuit. Larger gaps may be desirable in the sectioned foil where the sectioned foil is placed over areas where microwaves, radar, or radio frequency radiation is transmitted across the appliqué, for example, when the appliqué is covering an antenna or radome.

The appliqué containing the sectioned foil including sections forming a large area circuit may provide an electrical pathway to devices within the appliqué and/or devices external to the appliqué. These devices may include, but are not limited to, lights, antennas, communication devices, solar cells, measurement instruments, monitoring instruments, sensors, deicing resistors, electrical devices, capacitors, micromechanical devices, radio frequency identification tags, computer chips, active acoustic devices, active windows, electrochromics, electrochemical devices and power supplies. The sectioned metal foil may provide electrical supply to resistive materials between the separate metal foils within the appliqué to provide deicing capabilities. The separate foils providing a source of power to the resistive materials to allow the resistive materials to heat so as to perform de-icing and anti-icing. De-icing or anti-icing energy may be supplied directly to the exterior surface where the ice forms, and may be insulated from losses to the underlying structure. This significantly reduces power requirements for anti- or de-icing. The electrical devices may be connected to the large area circuit by suitable connections including low temperature solder, ink/printed solders, conductive adhesives, fuzz buttons, and electrical staples.

The appliqué containing the sectioned metal foil may help prevent high currents from destroying critical structure or from passing through fasteners that penetrate composite fuel tanks, thereby reducing sparking and explosion hazards. The foil may be sectioned to help reduce induced currents on an aircraft surface form effecting sensitive internal equipment, structure, hydraulic lines, or electrical lines by tailoring the current flow to travel on regions of the sectioned metal foil away from such areas or equipment. For example, a sectioned foil may be used on the antenna surface to protect the antenna from lightning and a solid foil may be used around the antenna to provide a path to ground.

The appliqué containing the sectioned metal foil may also make it possible to provide electrical connections to devices including radomes and antennas, especially communications antennas, as well as to provide lightning protection to those devices. This may also help reduce antenna integration problems by allowing lightning current and static charges to transfer from the surface of the antenna to an appliqué rather than to the underlying structure.

The sectioned metal foil may be formed by known lithographic etching techniques including laser etching the foil after the dielectric layer has been applied. It may also be formed via electroless or electrochemical methods. The appliqué may have electrical devices embedded within the foil layer or other layer of the appliqué so long as a connection is made to the foil circuit. Multiple layers of foil or sectioned foil including layers acting as large area circuits are also possible. A multilayer foil appliqué may be used to provide lightning protection to a large area circuit, especially if that large area circuit is being used to provide an electrical connection to flight critical devices. The devices themselves may be further protected from high current and voltage loads by circuit interrupts and breakers. Additionally, foil layers may provide protection from various types of radiation.

The sectioned metal foil may also have electrical connectors for electrically connecting the foil to devices external to the appliqué. An adhesive layer and a topcoat may then be applied. Optionally, the topcoat may be applied prior to the electrical connections to devices or the topcoat may be removed after application by laser, chemical or mechanical methods is specific areas to allow for later electrical connections. The sequence of applying the adhesive layer and the topcoat layer may vary, and the adhesive layer may be applied to the dielectric layer before the metal foil is applied.

Additionally, an appliqué containing a sectioned foil providing a large area circuit allows for the electrical monitoring of aircraft fuel tanks without a risk of explosion due to wires transgressing the fuel tank. An appliqué containing a sectioned foil providing a large area circuit has the advantage of allowing a method of providing an electrical pathway from one end of a wing to the other end without transgressing the fuel tanks.

The appliqué containing the sectioned foil providing a large area circuit does not require modifications to the exterior structure of the aircraft, so that no modifications are necessary to the structural performance of the skin or composite fabrication process. No or few holes are necessary through the structure of the aircraft for electrical connections where the appliqué is applied.

The appliqué containing sectioned foil providing a large area circuit is robust electrically compared to traditional circuit and wiring, since damage can occur to areas of the circuit while still allowing for an electrical connection to a device to be maintained because the electrical path may be wider than the area of damage. Also, the large area circuit may be able to monitor itself to provide feedback if there is a loss or change to the circuit, indicating possible damage to the circuit or appliqué or underlying structure.

Additionally, appliqués are easily replaceable and of low cost when compared to comparable paint and electrical delivery systems. The large area circuit may be easily combined with existing appliqués containing a foil for lightning diversion.

The appliqué of the present invention is well suited to aircraft, aerospace vehicles, and to other applications, including automobiles, boats, architectural coatings, and other commercial products.

Further aspects of the method and apparatus are disclosed herein. The features as discussed above as well as other features and advantages of the present invention will be appreciated and understood by those skilled in the art from the following detailed description and drawings.

DETAILED DESCRIPTION OF THE INVENTION

Figure 1:
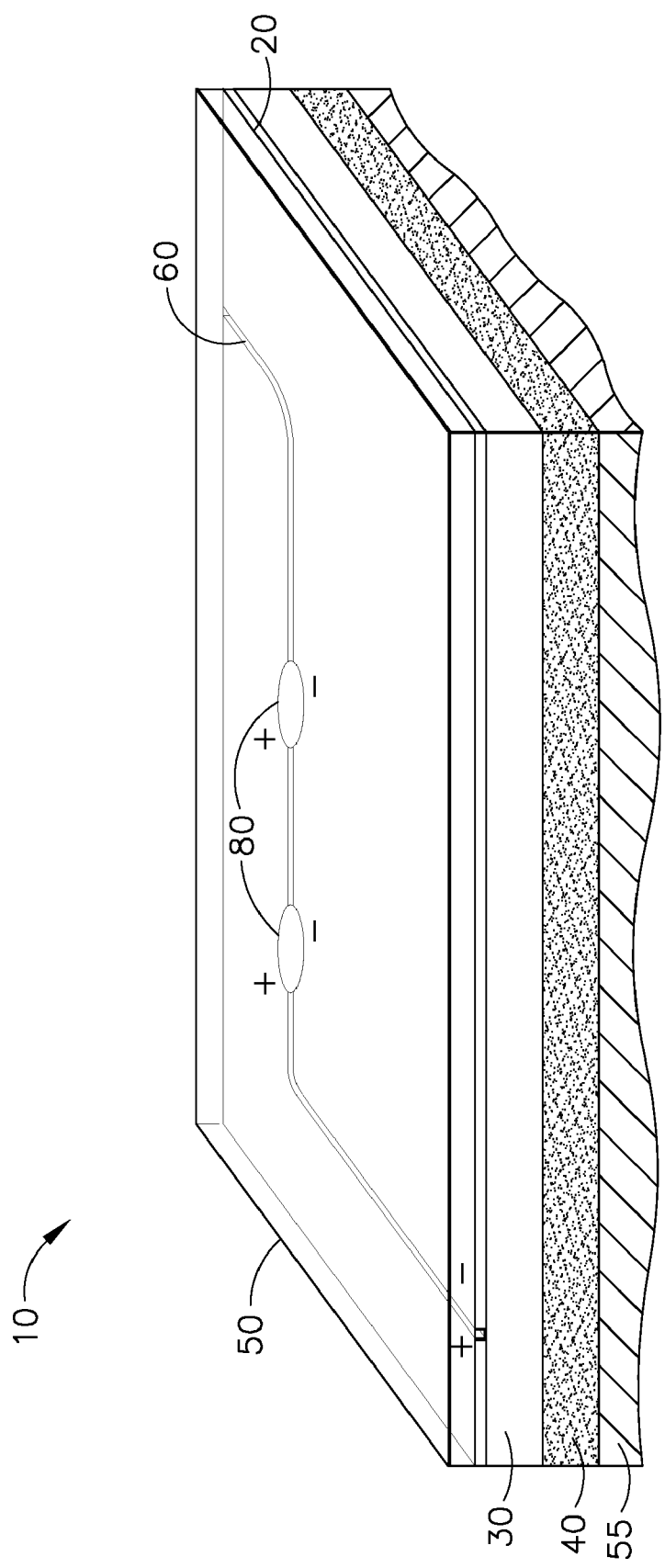
FIG. 1 depicts a cross-sectional view of an appliqué in accordance with an embodiment of the invention.

According to an embodiment of the present invention as shown in FIG. 1, an appliqué 10 is provided for a substrate. The appliqué 10 includes a sectioned metal foil 20 providing a large area circuit to the appliqué 10, a dielectric layer 30, an underlying adhesive layer 40, and a topcoat 50. The adhesive layer is used to apply the appliqué 10 to a substrate 55. Also shown in FIG. 1, is a gap 60 in the metal foil 20 that provides for a positive and negative electrical separation that allows for an electrical device to be plugged in or connected thereat, forming an electrical circuit. The sectioned foil 20 is shown providing an electrical connection to electrical devices 80.

Figure 2:
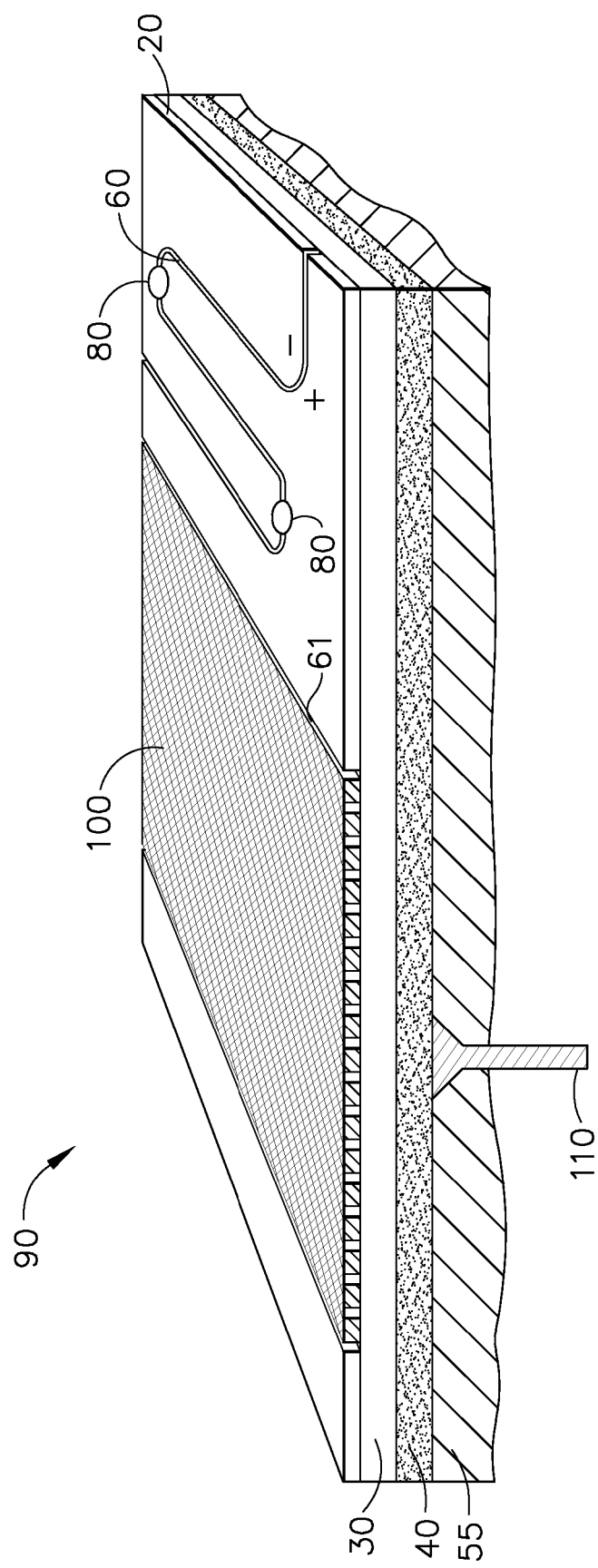
FIG. 2 depicts a cross-sectional view of an appliqué in accordance with another embodiment of the invention.

As shown in FIG. 2, an appliqué 90 is shown with a large area circuit section 20 and a lightning protection section 100. The lightning protection section 100 is shown patterned with a grid. The appliqué 90 is shown without a topcoat 50, but may be provided with a topcoat. Additionally, the appliqué 90 may be provided with an optional solid foil section (not shown). As such, the large area circuit section 20, the lightning protection section 100, and the optional solid foil section (not shown), all provide some degree of lightning protection to a substrate.

A single appliqué 10 may be less than about an inch to more than about several feet wide, with widths of about 36 inches and 48 inches used to provide a surface film for an aircraft. A single appliqué 10 may be less than an inch in length up to the length of a commercial aircraft fuselage or wing length, or up to approximately 200 feet, although greater lengths are possible depending upon application.

The topcoat 50 provides an external film to the appliqué. The topcoat 50 is typically a polymer film. The polymer film is typically an organic resin matrix composite and may be an elastomeric composite. The polymer film may be treated to effect microstructure and may contain various fillers and additives to add functionality including, but not limited to color, UV stability, radiation protection, and p-static characteristics. In a non-limiting example, the topcoat 50 is polyurethane, fluorinated urethane, polyurea, polyester, polyamide, PEEK, fluoropolymer or chloropolymer. The topcoat 50 is suitably tough, durable, and resistant to weather. For example, the topcoat 50 suitably provides increased durability and hardening to the sectioned metal foil 20. Similarly, the topcoat 50 may be markable so that removable indicia may be imprinted thereon. Alternately, the topcoat 50 may be transparent. Transparency may be desired when color or graphic patterns are included in layers underneath the topcoat 50 or if the desired effect is to appear as a metal surface. If desired, graphic patterns may be imbedded within the topcoat 50.

The topcoat 50 may be a fluoropolymer or fluoroelastomer. A suitable fluoroelastomer may be a modified CAAPCOAT Type III or Type IV rain and thermal resistant fluoroelastomer available from CAAP Company, which is suitable for roll coating in desired colors and with any desired additives such as for anti-static characteristics. In addition, the topcoat 50 may be polyurethane, polyolefin, polyamide, polyimide, halopolymer, ethylene propylene rubber, epoxy, polyester such as polyethylene terephthalate (PET), poly-ethylene naphthalate (PEN or the like), fluorosilicone, polyether sulfone (PES), or poly-ether ether ketone (PEEK). The topcoat 50 may be solvent cast, if desired. Fluoropolymers advantageously provide good water-shedding characteristics as well as increased resistance to fluids, such as hydraulic fluids like SKYDROL™ that may be present in or around aircraft. Polyamides, polyimides, polyesters, PEEK and the like also provide resistance to hydraulic fluids such as SKYDROL™. As discussed above, the topcoat 50 may be a chloroelastomer. Regardless of the composition of the topcoat 50, UV stability of the topcoat 50 helps ensure long-term durability of the coating system provided by the appliqué 10.

In addition, the topcoat 50 may contribute to aesthetic qualities, such as gloss or color through appropriate pigments and texture. Generally, the pigments are organic, metal flakes, metal oxide particles, and often are mixtures of several types of materials. Suitable aluminum flake pigments include the Aquasil PB series of pigments available from Siberline Manufacturing Co. The pigments might be glass, mica, metals, or glass flake, silver coated glass flake, mica flake, or the like available from Potters Industries, Inc. Metal pigments may include nickel, cobalt, copper, bronze, and the like from Novamet. These flakes typically are about 15-55 µm for their characteristic dimensions. Where the sectioned foil 20 forms a large area circuit, the pigments, if electrically conductive in nature, must be isolated from the foil 20 so as to not allow for an electrical pathway away from the foil 20. In areas of the appliqué containing the lightning protection section 100, it may be desirable to allow for conductive pigments in the topcoat 50 to provide electrical pathways to and from the lightning protection section 100 so as to provide electrical discharge points for forming a corona.

In some applications, ceramic pigments may be appropriate. Titanox titanium oxide pigments are available from NL Industries. Copper oxide or iron oxide pigments are available from Fischer Scientific. NANOTEK titania, zinc oxide, or copper oxide pigments are available from Nanophase Technologies Corporation. These pigments are generally spherical with diameters in the range from about 30 nm to micron size.

The topcoat 50 is suitably a thin layer. For example, the topcoat 50 may be between 0.0001-0.004 inches thick. In one preferred embodiment, the topcoat is around 0.0001-0.002 inches thick. Thinner layer are desirable over thicker layers because of weight savings when the appliqué 10 is used on an aircraft.

Additionally, when the topcoat 50 is thin and microporous, the topcoat 50 can aid in anti-static properties of the appliqué 10. If desired, anti-static material may be disposed within the topcoat 50. For example, electrically conductive material, such as without limitation graphite fibers or metal fibers, may be dispersed throughout the topcoat 50. The fibers disperse and dissipate the p-static charge, thereby mitigating buildup of the P-static charge in a localized area. This dispersion and dissipation reduces the possibility of electrical discharge that is a source of electrical noise to various communication systems onboard aircraft during flight. This dispersion and dissipation also reduces the possibility of personnel injuries if a person contacts the skin of an aircraft after the aircraft lands. Any conductive material in the topcoat 50 must be isolated from the sectioned foil acting as the large area circuit so as not to provide a separate conductive or resistive path from the foil. It should be noted that the foil itself will carry off p-static charge so long as the foil is grounded.

If desired, an optional ink layer (not shown) may be provided between the topcoat 50 and the patterned metal foil 20. The ink layer may provide a desired color and/or graphic design to the appliqué 10. The ink layer may provide color to the topcoat 50 that overlays the ink layer when viewing the topcoat 50. Advantageously, the ink layer may provide anti-static characteristics to the appliqué 10.

Alternatively, it may be desirable in some cases to paint over the topcoat 50 instead of providing an ink layer between the topcoat 50 and the patterned metal foil 20. In these instances, the topcoat 50 may have a matte texture to enhance adhesion of paint to the topcoat 50.

If further desired, an optional polymer film (not shown) may be provided between the topcoat 50 and the patterned metal foil 20. The optional polymer film may be used for any desired purpose. For example, a graphic image may be printed on the optional polymer film. The optional polymer film may be formed of the same materials and processed in the same or similar manner as the topcoat 50.

The topcoat 50 and the optional polymer film may be extruded or cast. When the topcoat 50 and the optional polymer films are cast with solvent, the topcoat 50 and optional polymer film are microporous and can provide a path for migration of P-static charges to the sectioned metal foil 20. As a result, the sectioned metal foil 20 may provide anti-static characteristics. This property may be desirable in sections of the sectioned metal foil providing protection from lightning strikes, but may not be desirable in sections providing large area circuitry.

Anti-static characteristics may be added to the topcoat 50 when cast, thus the static charge is advantageously dispersed over a wide area. As discussed above, this dispersion helps reduce the possibility of induction of electrical noise in electrical circuits inside the aircraft during flight and also helps reduce the possibility of personnel injuries if a person contacts the skin of an aircraft after the aircraft has landed but before the aircraft is electrically grounded. Static buildup may still occur on the surface of the appliqué, but by treating the appliqué, surface static charge may be controlled to decay in a short period of time, on the order of minutes, to minimize the problem.

The sectioned metal foil 20 may be formed of aluminum foil. For application to aircraft exteriors, the sectioned metal foil 20 should permit the appliqué 10 to elongate and to conform to surfaces of compound curvature. For example, a high-quality foil such as rolled aluminum foil may be used as the sectioned metal foil. Foil with a thickness of between about 0.0001 inch and about 0.002 inch may be used, and preferably, foils with a thickness of between about 0.0003 inch and about 0.001 inch may be used.

The sectioned metal foil 20 may be formed of any metal foil desired, such as aluminum, copper, nickel, gold, or titanium. A rolled foil provides substantial savings over metal foils created by metal deposition methods such as physical vapor deposition or sputtering, or by expanded mesh. While a metal foil provided by rolling may be thicker than foils obtained by deposition, the thickness of the rolled metal foil may nonetheless be less than about 0.001 inches thick. For example, a metal foil of less than about 0.0003 inches may be used. There are options for the use of thicker foils, greater than 0.001 inches, if higher currents are required to be carried by the foil.

The sectioned metal foil 20 is formed by creating a gap 60 in a metal layer. The gap 60 may be formed by any acceptable process, including laser etching or scribing a solid foil, electroforming, electroless or electroplating, etching, chemical-mechanical polishing, and various lithography processes such as photolithography. The gap width is determined by the amount of electrical energy carried by the sections adjacent the gap, so long as electrical isolation between the sections is provided. Gaps as small as about 0.0005 inches has been formed between sections of foil. Gaps of about 0.020 inches have been shown to provide a good separation for the large area circuit. Larger gaps may be desirable when forming large area circuits of high electrical load.

A laser process to generate a large area circuit sections in the metal foil may be rapid and large-scale, and even done roll-to-roll. Sections may be formed in a variety of shapes and sizes, and may be used in combination with solid foil. Sections of metal foil that are performing as wide area circuits may be combined with other sections of metal foil that are performing as lightning diverters. The sections functioning as wide area circuits are electrically isolated from the lightning diversion sections by an appropriate gap 61 or other electrically isolating separation techniques.

A large area circuit section performs by delivering an electrical current to an electrical device by an electrical current that is carried over the large area of the section. An electrical supply is provided to the large area circuit of the sectioned metal foil 20 at an appropriate attachment point (not shown). Devices 80 may be plugged into a gap 60 separating an electrically positive section of foil and an electrically negative section of foil, and placed in contact with the positive and negative sections so as to complete the circuit and become electrically energized. The width of the gap 60 is between about 0.0005 inches and 0.0015 inches. However, the gap 60 may be formed of any width as desired for a particular application. The devices 80 may include, but are not limited to, lights, antennas, communication devices, solar cells, measurement instruments, monitoring instruments, sensors, deicing resistors, electrical devices, capacitors, micromechanical devices, radio frequency identification tags, computer chips, active acoustic devices, active windows, electrochromics, electrochemical devices and power supplies.

A lightning diversion section 100 of the sectioned metal foil 20 performs by allowing electrical energy entering the section by a lightning strike to be spread over the area of the section and directed towards an appropriate ground. The lightning diversion section 100 may be separated by a gap 61.

The energy of the lightning strike is reduced by several factors. The lightning strike energy is first reduced by vaporizing metal in the vicinity of the strike. As the energy spreads over the section, additional energy is expended in the creation of plasma by ionizing air molecules along the surface of the section. Further energy is consumed in the formation of localized coronas at corners at the ends of sides of the section. If conductive particles are present in the topcoat 50, those particles may contribute to the reduction of energy by creating points of corona formation on the topcoat. Energy may spread to adjacent sections to further dissipate the amount of energy and protect the structure and electrical systems of the aircraft from damage.

Additionally, the sectioned metal foil 20 may also provide anti-static properties, elongation control and stiffness to the appliqué 10. For example, the sectioned metal foil has been shown to allow for elongation on the order of about 10 percent to about 45 percent during application of an appliqué to a complex shape. In addition, the sectioned metal foil, except for areas within the foil where the metal has been removed, provides complete UV opacity, and, as a result, UV protection for any underlying composite structure.

A dielectric layer 30 underlies the patterned metal foil 20. The dielectric layer 30 is preferably a polymer film. The dielectric layer 30 may be the same materials as the topcoat 50. For example, the dielectric layer 30 may be a poly ether ether ketone (PEEK) film, polysulfonate, polyester, polyamide, polyimide, polyethylene, polypropylene or any combination thereof. The dielectric layer 30 may be nylon. Nylon provides a moderately high dielectric strength of approximately 385 volts per 0.001 inches and is sufficiently resistant to hydraulic fluids, such as SKYDROL™. Also, nylon can bind readily to other materials, and is available in high-quality, inexpensive films.

The dielectric layer 30 may be a variety of other suitable materials. For example, the dielectric layer 30 may be a polyimide. Advantageously, polyamides bond easily with other materials. In addition, the dielectric layer 30 may be made from polyolefin, polyester, polyurethane, or halopolymer.

The dielectric layer 30 may be made of polyethylene or polyester in applications that experience a wide range of temperatures, such as temperatures between about −70° F. and about 180° F. Advantageously, plasma treating has been shown to effectively enhance bond strength of polyethylene and polyester to each other and to adhesives at low temperatures.

The dielectric layer 30 may be a two-layer polymer film combination. For example, the dielectric layer 30 may be a polyester/polyethylene combination, a polyester/nylon combination, a PEEK/polyethylene combination, a PEEK/nylon combination, or the like.

It is not necessary that the dielectric layer 30 be made from the same materials as the topcoat 50. Likewise, the dielectric layer 30 may be cast, extruded, sprayed or provided as a laminate. The dielectric layer 30 supports the patterned metal foil 20. Additionally, when the dielectric layer 30 is a high modulus plastic, the dielectric layer 30 provides stiffness and controlled elongation to the appliqué 10. The preferred thermoplastic polymer film forming the dielectric layer 30 is low cost, provides high dielectric strength, and is substantially free of holes that fluids or electrical charges may pass through.

If desired, either or both of the dielectric layer 30 and topcoat 50 may be plasma or corona treated to enhance bonding. Plasma treatment may be performed with oxygen or another gaseous chemical. Atmospheric treatment may be used.

The adhesive layer 40 underlies the dielectric layer for attachment to a substrate 55, such as an aircraft structure. The adhesive layer 40 is preferably a pressure sensitive adhesive (PSA). The PSA is preferably resistant to jet fuels, cleaning fluids, water, and high humidity environments. If possible, the adhesive should be resistant to aircraft hydraulic fluids, such as SKYDROL™. For example, the adhesive layer should be a pressure sensitive acrylic adhesive, such as A8 available from The Boeing Company of Seattle, Wash. Alternatively, other acceptable adhesives include 52-4 or 86-02 from the 3M Company of St. Paul, Minn. The adhesive layer 40 holds the appliqué 10 on a substrate during normal operation, such as flight of an aircraft. The adhesive layer 40 may also be peelable for replacement of the appliqué 10 without leaving a significant residue on the substrate 55.

The thickness of the adhesive layer 40 contributes to spacing apart the sectioned metal foil 20 and the dielectric layer 30 from the substrate. As a result, the thickness of the adhesive layer 40 contributes to raising the dielectric breakdown voltage by increasing insulation between the sectioned metal foil 20 acting as a large area circuit and the substrate. Additionally, in areas where the sectioned metal foil is providing lightning protection, the adhesive layer 40 further contributes to lightning protection by increasing the dielectric breakdown voltage between the sectioned metal foil 20 and the substrate 55.

The side of the adhesive layer 40 to be placed in contact with the substrate may be treated with a surface treatment, such as corona or plasma treatment. The adhesive layer 40 may be laminated or cast directly onto the dielectric layer 30. A surface treatment, such as corona or plasma treatment or primer, may be applied to the side of the adhesive layer 40 adjacent to the dielectric layer 30 to increase adhesion.

An additional primer or adhesive layer may be adjacent to either or both sides of the sectioned metal foil 20 to increase adhesion between the patterned metal foil 20 and any adjacent layer. For example, an adhesive layer may be applied between the patterned metal foil 20 and an ink layer. This adhesive layer is preferably a standard laminating adhesive.

Total thickness of the appliqué 10 may be less than 0.004 inches. The adhesive layer 40 and the dielectric layer 30 may contribute to about 0.0015 inches to about 0.0025 inches of thickness. The topcoat 50 and any additional layers, such as an ink layer and/or additional adhesive layers, may contribute about 0.002 inches. Because of such a thin profile, the appliqué 10 is of a reduced weight.

It may be desirable to provide an increased thickness for the dielectric layer 30. An increased thickness of the dielectric layer 30 results in higher breakdown voltage. The dielectric layer 30 may provide greater insulation of the large area circuit formed by the foil 20. Additionally, with a greater thickness, the dielectric layer 30 may withstand an even higher electrical potential before undergoing dielectric breakdown, thereby increasing protection against lightning strikes. However, increasing the thickness of the dielectric layer 30 increases weight and/or decreases conformability to complex surface curvatures. Thus, a desire for increased dielectric strength for the dielectric layer 30 should be balanced with an increase in weight and decrease in conformability, aircraft structures typically designed with a concern to minimize weight.

In addition, the appliqué 10 may fatigue or crack like paint before significant disbanding of the appliqué 10 may occur. Such fatigue may occur at points such as where fasteners and joints are present upon an aircraft structure, and where air may attempt to exit. The appliqué 10 is tatterable so that it will shred locally during flight of an aircraft upon damage, thereby limiting progress of any peels that may have initiated from maintenance damage or rain impingement at appliqué edges.

The appliqué 10 is removable by peeling, when desired, for inspection or replacement, but advantageously remains adhered during flight.

The appliqué 10 may be fabricated at low cost. The appliqué 10 may be fabricated by a commercial large-scale fabrication processes such as laminating, casting, spraying and extruding any appliqué layers including the topcoat 50, the patterned metal foil 20, and the dielectric layer 30. The foil 20 may be attached to the dielectric layer as a solid foil prior to etching a pattern into the foil. The foil 20 may then be treated to form large area circuit sections or patterned or solid lightning reduction sections. The appliqué 10 may be fabricated in large quantities, thereby achieving economies of scale in fabrication costs.

Multilayer construction of the appliqué 10 allows incorporation of the topcoat 50 as a top layer that provides high durability, UV stability, abrasion resistance, and superior gloss using a defined structure. In addition, performance and aesthetic characteristics of the appliqué 10 are tailorable to desired applications. For example, additional adhesive and polymer film layers may be added to the appliqué 10 to increase strength. An ink layer or additional adhesive layer may be applied between the patterned metal foil 20 and the topcoat 50 to provide operational characteristics such as antistatic purposes, or for aesthetic purposes, such as providing color, graphic images or camouflage. To tailor appliqué characteristics, any of the layers formed of a polymer film may be modified by including surface patterns, and might include plasticizers, extenders, antioxidants, ultraviolet light stabilizers, dyes, pigments, emissivity agents such as silicon carbide, chopped or continuous fiber reinforcement, or the like, to provide desired color, gloss, hydrophobicity, anti-ice, or other surface characteristics. Chopped or continuous fibers may provide additional toughness and strength, and can provide anti-static properties in the most exterior layers.

The appliqué 10 may be protected with a single or double transfer protective paper or plastic film to facilitate application. For example, one sheet of a protective paper may be applied to the adhesive layer 40 on the side of the adhesive layer 40 to be applied to a substrate, to protect the adhesive layer from dirt and to prevent the adhesive layer 40 from inadvertently sticking to itself or other objects until the appliqué 10 is ready for installation. When the appliqué 10 is very thin, the topcoat 50 may have a protective paper film applied so as to protect the topcoat 50 during transfer and positioning, and to also provide additional reinforcement. The protective paper or film is peeled off following proper positioning of the appliqué 10. If desired, identifying information and instructions regarding how, where, and in what order to apply the appliqué 10 can be printed on the transfer paper to simplify the placement and positioning of the appliqué 10. Alternatively, the identifying information and instructions may be printed directly on the topcoat 50.

An example is provided as to the placement of an appliqué upon an aircraft. For the purpose of example, only a single appliqué panel providing a single large area circuit will be discussed, however, the entire aircraft structure may be covered with appliqués providing multiple functions. An appliqué 10 containing a sectioned metal foil 20 is placed upon an upper wing surface. The metal foil is patterned so as to provide a large area circuit as shown in FIG. 1. Embedded within the appliqué 10, is an electrical device 8 consisting of two lights. An electrical current is provided to the patterned metal foil at or about a point of electrical connection 70 so as to form positive and negative connections to the lights as shown in FIG. 1. Electrical connection to the appliqué 10 may be by low temperature solders, ink/printed solders, conductive adhesives, fuzz buttons, stapled connections or any other acceptable method.

The appliqué 10 may be connected to adjacent appliqués so as to provide a continuing electrical circuit to those appliqués, or the large area circuit of the appliqué 10 may terminate therein. The appliqué 10 may be positioned adjacent to another appliqué containing a separate large area circuit, or may be positioned adjacent to an appliqué containing metal foil for protection from lightning strikes as shown in FIG. 2. The appliqué 10 may be placed adjacent to appliqués containing no metal foil layer. The appliqué 10 may be placed adjacent to an appliqué containing any combination of functions as described above, or adjacent to no appliqué at all. When the appliqué 10 is provided to an area that experiences heat or that is particularly prone to erosion, the appliqué 10 may require additional treatment or coating.

While curvature of a structure determines size and shape of the appliqué 10, a typical appliqué 10 applied to an upper wing skin may be square, rectangular or curved. The appliqué 10 is typically made from flat material and accommodates curvature by inherent plasticity, deformability, and resilience of the appliqué 10. As discussed above, the appliqué 10 is suitably made from materials that are relatively forgiving and easy to apply. Flat appliqués may be used for cylindrical solids, flat surfaces, and any other large areas with moderate curvature. It has been determined that an entire aircraft can be covered using flat appliqué panels. The size of the appliqué 10 depends on the severity of the curvature of the surface it will cover. Smaller pieces are used in areas containing extensive three dimensional curvature. The appliqué must be elongated either during installation or prior to installation to match the surface curvature.

The appliqué 10 may be applied wet or dry using squeegees, mat knives, rubber rollers, wallpaper tools, and the like, to place and smooth the appliqué 10. Air or water trapped in bubbles may be removed with a hypodermic syringe. Adjacent appliqués usually are overlapped by about 0.25 to 0.5 inches or more, however butt joints are also possible. The extent of overlap is limited because of weight and cost factors, but also because the appliqués may stick more securely to the aircraft surface than to one another, depending upon the adhesive layer 40 and the topcoat layer 50.

The appliqué 10 may be used on most aerospace metals, including 2024, 6061, 7075, and other aluminum alloys; all titanium alloys; high strength/low carbon steels including 4130, 4340, and 9310; nickel alloys like INCONEL 718; and magnesium alloys protected with a conversion coating. In addition, the appliqué 10 may be used on composite structures. At the interface between the carbon fiber-reinforced composites and the metallic structure, the appliqué 10 reduces corrosion to a metal surface by reducing access of electrolytes to the metal surface, that is, the appliqué 10 seals moisture, oxygen and aircraft fluids away from the metal surface.

In an alternative embodiment of the invention, an appliqué is formed without a topcoat layer. The appliqué is formed of a sectioned metal foil, with a dielectric layer underlying the sectioned metal foil. An adhesive layer is between the dielectric layer and a substrate. Overtop the patterned metal foil, a paint is applied. By applying a paint in place of a topcoat, the appliqué may be customized in appearance and aesthetics as desired by a particular application.

If desired, a protective treatment or primer maybe applied to the sectioned metal foil. The protective treatment or primer may protect the metal of the sectioned metal foil from corrosion and/or may enhance bonding of a paint or polymer film to the sectioned metal foil. For example, a protective treatment or primer may include anodizing, Alodine® or other conversion coatings or treatments, electrodeposition, thin adhesives, primer, sol-gel, or other similar protective treatments.

The appliqué may have a maskant that covers the sectioned metal foil. The maskant may protect the patterned metal foil from dirt and damage during handling and application, as well as maintain quality and integrity of the appliqué during storage and installation. The maskant may also help control elongation of the appliqué during installation. The maskant is removable from the patterned metal foil after the appliqué is applied. When an optional protective treatment or primer is applied, the maskant may help maintain the quality and bondability of the protective treatment or primer. The maskant is removed prior to painting and/or lap joint installation. The maskant may be left intact after installation to the extent possible, thereby providing protection for the appliqué during part assembly and shipping. The removable maskant typically may be a low cost polymer film, such as polyethylene, polypropylene, or polyester. Alternately, the maskant may be paper with a low-tack pressure sensitive adhesive, thereby allowing the maskant to be preferentially removed from the appliqué after installation.

The appliqué 10 may be further electrically isolated from a substrate to allow for higher electrical currents to be carried by the sectioned metal foil. These currents may be from higher applied voltages as provided by the wide area circuit of the patterned metal foil, and/or may be a result of a lightning strike. The isolation of the metal foil 20 may be particularly important in the vicinity of fasteners, such as a fastener 110 as shown in FIG. 2.

It has been shown that electrical energy preferably seeks a fastener 110 that extends through a substrate 55 and fastens the substrate 55 to underlying structure. This is because the fastener 110 may present a path to an electrical ground either directly or via graphite fibers that are exposed at the perimeter of the fastener hole. Although the dielectric layer 30 of the appliqué can provide sufficient dielectric isolation between the foil 20 and the underlying aircraft structure, including fasteners, the overall weight of the appliqué may be reduced by reducing the thickness of the dielectric layer by preferably including additional dielectric material and/or voltage separation at fasteners or other discontinuities. The additional dielectric material may be in the form of an additional dielectric coating or layer at or near the vicinity of a fastener or joint. Providing additional dielectric material only at or near the vicinity of a fastener or joint may provide additional weight savings.

The additional dielectric layer may be of the same material as the dielectric layer 30. The additional dielectric layer may be cut into any shape as desired to cover a fastener. The additional dielectric layer may be cut into a round shape or strip that at least covers the head of a fastener. In order to help the additional dielectric layer to adhere to a fastener, an adhesive, and particularly a PSA, may be applied to an underside of the additional dielectric layer. The PSA may be applied to the head of the fastener. The adhesive may be similar to the adhesive used on the underside of the dielectric layer as described above.

Alternative arrangements of material may also provide for additional isolation of the foil 20 from a substrate 55 or panel joints. For example, the thickness of the dielectric layer 30 may be increased over a fastener 110, or an extra layer of the dielectric layer may be provided over a fastener 110. Furthermore, materials with high dielectric breakdown properties, such as PET or nylon or perfluoroalkoxy (PFA), may be used as the dielectric layer over a fastener 110. The dielectric layer 30 may be constructed of multiple blocks of different film and/or adhesive adjoined to one another within a single appliqué 10. Also, the thickness of the dielectric layer 30 may be increased in the area proximate to a fastener 110. The adhesive layer 40 also provides electrical isolation between the foil 20 and the substrate 55.

An edge finish may be applied to butt joints of adjacent appliqués. The edge finish provides a physical barrier for butt joints to protect the underlying substrate from ultraviolet radiation, moisture, rain, air impingement, physical contact, and the like. The edge finish may also be used with lap joints between overlapping appliqués.

The edge finish, which may be in the form of a layered composite, may be formed of a polymer film and an adhesive. The polymer film and adhesive materials of the edge finish may be the same or similar to the appliqué 10. The adhesive may be a PSA, a thermosetting adhesive, or a thermoplastic/hot melt adhesive, as desired for a particular application. The adhesive layer would be adjacent to the butt joint, with the polymer film placed thereupon. The placement order of the polymer film and adhesive as well as the number of polymer films and adhesive layers, may be varied based on application. Other wet sealant products, for example metal filled epoxies or polysulfides, may also be used to provide physical barrier properties.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An appliqué comprising:
    a sectioned foil comprising two adjacent foil sections;
    a gap separating the two adjacent foil sections;
    a dielectric layer underlying the sectioned foil;
    an electrical device disposed in the gap and electrically connecting the two adjacent foil sections; and
    an electrical supply electrically connected to the two adjacent foil sections to form a large area circuit section;
    wherein the two adjacent foil sections are configured to provide electrical energy to the electrical device connected to the two adjacent foil sections.

2. The appliqué of claim 1, wherein the large area circuit section comprises electrically positive and electrically negative sections separated by the gap.

3. The appliqué of claim 1, wherein the sectioned foil further comprises patterned or solid foil sections to conduct lightning strike energy.

4. The appliqué of claim 1, wherein the dielectric layer is a polymer film.

5. The appliqué of claim 1, further comprising a topcoat overlaying the sectioned metal foil.

6. The appliqué of claim 1, further comprising an adhesive underlying the dielectric layer.

7. An appliqué system comprising:
    a sectioned foil comprising two adjacent foil sections;
    a gap separating the two adjacent foil sections;
    a dielectric layer underlying the sectioned foil;
    an adhesive layer underlying the dielectric layer;

a substrate underlying the adhesive layer; and
a topcoat overlaying the sectioned foil;
an electrical device in electrical connectivity between the two adjacent foil sections; and
an electrical power supply connected to the two adjacent foil sections;
wherein the two adjacent foil sections and the electrical power supply form an electrical circuit with the electrical device.

8. The appliqué system of claim 7, further comprising additional patterned or solid sections of the sectioned foil capable of providing protection against lightning strikes.

9. The appliqué system of claim 8, wherein the dielectric layer comprises a polymer film.

10. The appliqué system of claim 8, wherein the topcoat comprises a polymer film or a paint.

11. The appliqué system of claim 8, wherein an electrical device selected from a group comprising lights, antennas, communication devices, solar cells, measurement instruments, monitoring instruments, sensors, deicing resistors, electrical devices, capacitors, micromechanical devices, radio frequency identification tags, computer chips, active acoustic devices, active windows, electrochromics, electrochemical devices and power supplies is connected to the electrical circuit section.

12. The appliqué system of claim 8, wherein the foil is selected from a group comprising aluminum and copper.

13. The appliqué of claim 8, wherein the foil is less than about 0.002 inches thick.

14. A method of forming an appliqué comprising
providing a foil;
sectioning the foil to form a large area circuit comprising two adjacent foil sections separated by a gap;
providing a dielectric layer underlying the foil;
electrically connecting an electrical device to the adjacent foil sections to form an electrical circuit;
electrically connecting an electrical power supply to the electrical circuit; and
oppositely charging the two adjacent foil sections.

15. The method of claim 14, wherein the foil is sectioned by laser etching.

16. The method of claim 14, wherein the foil is connected to electrical devices.

17. The method of claim 16, wherein a topcoat is applied to the foil.

18. The method of claim 17, wherein the topcoat is selected from a group comprising a polymer film and a paint.

19. The method of claim 14, further comprising sectioning the foil to form lightning protection sections.

20. The method of claim 19, wherein the lightning protection sections are patterned or solid sections.

* * * * *